(12) United States Patent
Son et al.

(10) Patent No.: US 8,350,336 B2
(45) Date of Patent: Jan. 8, 2013

(54) SEMICONDUCTOR DEVICE AND METHOD OF MANUFACTURING THE SAME

(75) Inventors: Yong-Hoon Son, Yongin-si (KR); Jong-Wook Lee, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 141 days.

(21) Appl. No.: 12/943,470

(22) Filed: Nov. 10, 2010

(65) Prior Publication Data

US 2011/0049534 A1    Mar. 3, 2011

Related U.S. Application Data

(62) Division of application No. 12/316,693, filed on Dec. 16, 2008, now Pat. No. 7,851,327.

(30) Foreign Application Priority Data

Dec. 18, 2007  (KR) .......................... 10 2007 0132934

(51) Int. Cl.
 *H01L 29/76* (2006.01)
 *H01L 29/94* (2006.01)

(52) U.S. Cl. ........ 257/374; 257/369; 257/506; 257/510; 438/207; 438/218

(58) Field of Classification Search .................. 257/369, 257/374, 506, 510, 647, E27.06; 438/199, 438/107, 218
See application file for complete search history.

(56) References Cited

U.S. PATENT DOCUMENTS

| 3,861,968 A | 1/1975 | Magdo et al. |
| 6,639,288 B1 * | 10/2003 | Kunikiyo ...................... 257/412 |
| 2008/0179657 A1 | 7/2008 | Tasaka |

FOREIGN PATENT DOCUMENTS

| JP | 59194445 | 11/1984 |
| JP | 2005057147 | 3/2005 |
| KR | 20020034471 | 5/2002 |
| KR | 100650861 | 11/2006 |

OTHER PUBLICATIONS

"Method of Manufacturing a Semiconductor Device Including Forming a Single-Crystalline Semiconductor Material in a First Area and Forming a Second Device Isolation Pattern on a Second Area" Specification, Drawings, and Prosecution History, of U.S. Appl. No. 12/316,693, filed Dec. 16, 2008, by Yong-Hoon Son, et al.

* cited by examiner

*Primary Examiner* — Theresa T Doan
(74) *Attorney, Agent, or Firm* — Onello & Mello LLP

(57) ABSTRACT

In a semiconductor device and a method of manufacturing the same, a first insulation layer is removed from a cell area of a substrate and a first active pattern is formed on the first area by a laser-induced epitaxial growth (LEG) process. Residuals of the first insulation layer are passively formed into a first device isolation pattern on the first area. The first insulation layer is removed from the second area of the substrate and a semiconductor layer is formed on the second area of the substrate by a SEG process. The semiconductor layer on the second area is patterned into a second active pattern including a recessed portion and a second insulation pattern in the recessed portion is formed into a second device isolation pattern on the second area. Accordingly, grain defects in the LEG process and lattice defects in the SEG process are mitigated or eliminated.

3 Claims, 8 Drawing Sheets

SEMICONDUCTOR DEVICE AND METHOD OF MANUFACTURING THE SAME

RELATED APPLICATIONS

This application is a divisional application of U.S. patent application Ser. No. 12/316,693, filed on Dec. 16, 2008, which claims the benefit of Korean patent application number 10-2007-0132934, filed on Dec. 18, 2007, in the Korean Intellectual Property Office, the contents of which applications are incorporated herein in their entirety by reference.

BACKGROUND

1. Field

Example embodiments relate to a semiconductor device and a method of manufacturing the same, and more particularly, to a semiconductor device and a method of manufacturing the same in which poly grains are minimized in an active region of a peripheral/core area of a substrate.

2. Description of the Related Art

Generally, conventional manufacturing methods for semiconductor devices usually require device isolation layers for electrically separating unit conductive structures, such as gate structures, in the semiconductor device. One of the most widely known processes for forming a device isolation layer is a field oxidation process. According to the field oxidation formation process, an anti-oxidation pattern is formed on an active region of a substrate on which the unit conductive structures for the semiconductor device and an oxide layer is formed on a field region surrounding and defining the active region in a furnace. The above field oxidation process has been primarily based on a thermal diffusion process in a horizontal direction parallel with the substrate, and thus has had many limitations for forming the device isolation layer because the device isolation layer requires electrical insulation in a vertical direction perpendicular to the substrate. For that reason, a shallow-trench isolation (STI) process has been suggested, in which a shallow trench is formed around the active region to thereby define the active region and the shallow trench is filled with an insulation layer such as an oxide layer.

However, the conventional STI process requires many processing steps for device isolation, and thus has high process complexity and low process efficiency due to the high process complexity. In addition, continued increased device integration and continued reduction of the design rule in semiconductor devices result in the deterioration of gap-fill characteristics of the insulation layer in the trench.

For addressing the above-mentioned drawbacks of the conventional STI process, there has been suggested a process in which the active region is actively formed on a substrate to thereby passively form the device isolation layer in a process that reverses the steps of the conventional STI process in which the device isolation layer is actively formed in the trench of the substrate to thereby passively define the active region of the substrate.

For example, in the active-formation process, an insulation layer is formed on a substrate and partially removed from the substrate to thereby form an opening through which the active region of the substrate is exposed, and then an epitaxial layer is grown from a surface of the substrate in the active region by a selective epitaxial growth (SEG) process. Accordingly, the insulation layer surrounding the epitaxial layer in the active region is passively formed in the device isolation layer in a field region of the substrate. However, under this approach, various SEG process failures have been generated at a boundary surface between the epitaxial layer in the active region and the insulation layer in the field region due to the presence of crystal defects in the SEG process. A laser-induced epitaxial growth (LEG) process has been suggested for overcoming the above SEG process failures.

FIGS. 1A to 1F are cross-sectional views illustrating a method of manufacturing a conventional semiconductor device in which an active region is formed on a substrate by an LEG process.

Referring to FIG. 1A, a lower oxide layer 12a, a nitride layer 12b and an upper oxide layer 12c are sequentially stacked on a substrate 10 to thereby form an insulation layer 12 on the substrate 10. A photoresist pattern 14 is formed on the insulation layer 12 in such a manner that portions of the insulation layer corresponding to an active region of the substrate 10 is exposed through the photoresist pattern 14.

Referring to FIG. 1B, an etching process is performed against the insulation layer 12 using the photoresist pattern 14 as an etching mask, to thereby form an opening 15 through which a portion of the substrate corresponding to the active region is exposed.

Referring to FIG. 1C, the photoresist pattern 14 is removed from the insulation layer 12 and a polysilicon layer (not shown) is formed on the substrate 10 to a sufficient thickness to fill up the opening 15. Then, the polysilicon layer is partially removed from the insulation layer 12 by a chemical mechanical polishing (CMP) process until a top surface of the insulation layer 12 is exposed, and thus the polysilicon layer remains in the opening 15. Accordingly, a polysilicon pattern 16 is formed on the substrate 10 in accordance with the opening 15, and an upper surface of the insulation layer 12 is coplanar with an upper surface of the polysilicon pattern 16.

Referring to FIGS. 1D and 1E, a laser is irradiated onto the substrate including the polysilicon layer 16, to thereby transform the polysilicon layer into a single-crystalline silicon pattern 18. For example, when an excimer laser is irradiated onto the upper surface of the polysilicon layer 16, the polysilicon layer 16 is momentarily melted and recrystallized into single-crystalline silicon to thereby form the single-crystalline silicon layer 18 in the opening 15. The single-crystalline silicon recrystallized from the polysilicon layer 16 is grown to the single-crystalline silicon layer 18 by a selective epitaxial growth (SEG) process using the crystal structure of the substrate 10, which can be single-crystal in structure, exposed through the opening 15. The above SEG process is performed on a conductive body and is not performed on a non-conductive body, and thus the single-crystalline silicon is relatively less grown at a boundary surface between the polysilicon layer 16 and the oxide layer 12c that is an insulation layer, to thereby form a groove 18a.

Referring to FIG. 1F, the upper oxide layer 12c and an upper portion of the single-crystalline silicon layer 18 is removed from the substrate by a planarization process, to thereby remove the groove 18a from the substrate.

For example, the upper oxide layer 12c and the upper portion of the single-crystalline silicon layer 18 adjacent to the upper oxide layer 12c are planarized by a CMP process until a top surface of the nitride layer 12b is exposed, and thus an upper surface of the planarized single-crystalline silicon layer 18 is coplanar with the top surface of nitride layer 12b. Accordingly, the groove 18a interposed between the single-crystalline silicon layer 18 and the insulation layer 12 is removed from the substrate 10 and the active region 19 is formed on the substrate 10 between the adjacent residual insulation layers including the lower oxide layer 12a and the nitride layer 12b.

The residual insulation layer surrounds and defines the active region 19 on the substrate 10; thus, conductive structures on the adjacent active regions are electrically separated from each other by the residual insulation layer 12 around the active region 19. That is, the residual insulation layer functions as a device-isolation layer in a semiconductor device.

However, when the optical energy of the laser is irradiated onto a relatively large area of the polysilicon layer 16, the polysilicon layer 16 is partially melted in the same surface to thereby form poly grains on a local area of the surface of the polysilicon layer 16. Accordingly, the polysilicon layer 16 is locally transformed into a single-crystalline silicon layer in the opening 15, which can thereby lead to deterioration of the electrical characteristics of the active region 19.

Particularly, in the case of a semiconductor device, an active region of a cell area has a relatively small size and has uniform distribution on the substrate, while an active region of a peripheral/core area has a relatively large size and has non-uniform distribution on the substrate. Therefore, when both the cell area and peripheral/core area of the substrate undergo the same LEG process, the optical energy of a laser sufficient for fully melting the polysilicon layer in the cell area is not sufficient for fully melting the polysilicon layer in the peripheral/core area, and thus the polysilicon layer in the peripheral/core area of the substrate is insufficiently melted by the same LEG process. Accordingly, some of the polysilicon layer in the peripheral/core area of the substrate is formed into poly grains and some is formed into the single-crystalline silicon layer. That is, the polysilicon layer is not uniformly formed into the single-crystalline silicon layer over the entire peripheral/core area of the substrate due to the local poly grains, which thereby deteriorates the uniformity of the resulting single-crystalline silicon layer and the electrical characteristics of the active region.

FIGS. 2A to 2D are views illustrating processing steps for transforming a polysilicon layer into poly grains in the peripheral/core area of the substrate.

Referring to FIGS. 2A and 2B, the polysilicon pattern 16 is formed in the opening 15 at the peripheral/core area of the substrate 10 by a deposition process and a CMP process, and the laser is irradiated onto the polysilicon pattern 16. The laser has the same optical energy as the laser that is irradiated onto polysilicon pattern at the cell area of the substrate 10. The portion of the optical energy of the laser exceeding the allowable light absorption degree of polysilicon is emitted to surrounding regions as thermal energy, as shown in FIG. 2B. Since the heat transfer through the single-crystalline silicon substrate 10 is much greater than that through the insulation layer 12, latent heat of the polysilicon pattern 16 is much greater at a side portion of the opening 15 making contact with the insulation layer 12 than at a central portion of the opening 15. Therefore, as shown in FIG. 2C, the polysilicon pattern 16 has a first melting depth D1 at the central portion of the opening 15 in accordance with the light absorption degree of the polysilicon and has a second melting depth D2 at the side portion of the opening 15 in accordance with the light absorption degree and the latent heat of the polysilicon pattern 16.

Referring to FIG. 2D, first grains G1 are formed on a residual polysilicon pattern in the central portion of the opening 15 along the first depth D1 and second grains G2 are formed on the residual polysilicon pattern in the side portion of the opening 15 along the second depth D2. Since the second depth D2 is much greater than the first depth D1 in the opening 15, the first grains become small-sized and dense and the second grains G2 become large-sized and sparse.

Therefore, when both of the cell area and the peripheral/core area of the substrate undergoes the same LEG process to form active regions of a semiconductor device, no poly grains are found at the cell area while a plurality of poly grains can still be found at the peripheral/core area because the peripheral/core area is relatively larger than the cell area.

SUMMARY

Embodiments of the present invention provide a method for actively forming the active regions of a semiconductor device in which poly grains are minimized at a boundary surface between the active region and the device isolation layer surrounding the active region to thereby reduce process failures due to the poly grains. Embodiments of the present invention further provide semiconductor devices formed according to the method.

Example embodiments provide a semiconductor device having minimized process failures at active regions of a peripheral/core area of a substrate to thereby improve the electrical stability of the semiconductor device.

Example embodiments also provide a method of manufacturing the above semiconductor device.

According to some example embodiments, there is provided a semiconductor device including a semiconductor substrate having defined thereon first and second areas, a first active pattern and a first device isolation pattern on the first area of the substrate and a second active pattern and a second device isolation pattern on the second area of the substrate. The first active pattern may include first single-crystalline semiconductor material grown from a surface of the first area of the substrate and the second device isolation pattern may include first insulation material and defines the first active pattern on the first area of the substrate. Therefore, neighboring elements of the first active patterns may be electrically insulated from each other. The second active pattern may include second single-crystalline semiconductor material grown from a surface of the second area of the substrate and the second device isolation pattern may include second insulation material and may define the second active pattern. Therefore, the second device isolation pattern may electrically insulate neighboring elements of the second active patterns from each other and a side profile of the second device isolation pattern has an inclination angle that is opposite that of a side profile of the first device isolation pattern.

In an example embodiment, the first active pattern includes a first epitaxial pattern formed by a laser-induced epitaxial growth (LEG) process and the second active pattern includes a second epitaxial pattern formed by a selective epitaxial growth (SEG) process. The first and second active patterns includes at least one material selected from the group consisting of silicon (Si), germanium (Ge), silicon germanium (SiGe), silicon carbide (SiC) and combinations thereof.

In an example embodiment, the semiconductor device further comprises first and second lower conductive structures on the first and second active patterns, respectively, the first lower conductive structure including a first lower gate insulation layer on a surface of the first active pattern and a first lower gate conductive layer on the first lower gate insulation layer, and the second lower conductive structure including a second lower gate insulation layer on a surface of the second active pattern and a second lower gate conductive layer on the second lower gate insulation layer. In an example embodiment, the semiconductor device further comprises: an insulation interlayer covering the first lower conductive structure and having a supplementary opening through which the first active pattern is partially exposed, an upper surface of the insulation interlayer being planarized; a plug layer comprising a third single-crystalline semiconductor material and filling the supplementary opening; an upper active layer on the insulation interlayer, the upper active layer comprising a fourth single-crystalline semiconductor material and making contact with the plug layer; and an upper conductive structure on the upper active layer, the upper conductive structure including an upper gate insulation layer on the upper active layer and an upper gate conductive layer on the upper gate insulation layer.

According to some example embodiments, there is provided a method of manufacturing a semiconductor device. A first insulation layer may be partially removed from a first area of a semiconductor substrate, thereby forming an opening defining a first active region of the first area of the substrate and forming a first insulation pattern including a residual first insulation layer surrounding the opening. Then, a first active pattern may be formed on the first active region of the first area of the substrate by filling the opening with first single-crystalline semiconductor material, thereby transforming the first insulation pattern surrounding the first active pattern into a first device isolation pattern on the first area of the substrate. A semiconductor layer including second single-crystalline semiconductor material may be partially removed from the second area of the substrate, thereby forming a recessed portion through which a second field region defining a second active region on the second area of the substrate is formed and forming a second single-crystalline semiconductor pattern including a residual semiconductor layer surrounding the recessed portion. A second device isolation pattern may be formed on the second field region of the second area of the substrate by filling the recessed portion with a second insulation layer, thereby transforming the second single-crystalline semiconductor pattern surrounding the second device isolation pattern into a second active pattern on the second area of the substrate.

In an example embodiment, the first active pattern may be formed on the first area of the substrate by example processing steps: A non-crystalline semiconductor pattern may be formed on the substrate by filling the opening with non-crystalline semiconductor material, and then a preliminary single-crystalline semiconductor pattern may be formed in the opening by an epitaxial process on the non-crystalline semiconductor pattern. Finally, an upper portion of the preliminary single-crystalline semiconductor pattern and an upper portion of the residual insulation layer may be removed from the substrate by a planarization process, thereby forming a first single-crystalline semiconductor pattern as the active pattern. For example, the epitaxial process for forming the preliminary single-crystalline semiconductor pattern may include a laser-induced epitaxial growth (LEG) process. The LEG process is performed by using an excimer laser having optical energy of a range from about 1,000 mJ/cm$^2$ to about 2,500 mJ/cm$^2$.

In an example embodiment, the first insulation layer may include a multilayer structure in which a first oxide layer, a nitride layer and a second oxide layer are sequentially stacked on the first area of the substrate and the planarization process may be performed until an upper surface of the nitride layer is exposed, so that a facet defect between an upper corner portion of the insulation pattern and the preliminary single-crystalline semiconductor pattern is removed from the first area of the substrate.

In an example embodiment, the first insulation layer may be further formed on both of the first and the second areas of the substrate and thus the first insulation layer may be removed from the second area of the substrate after formation of the first active pattern and the first device isolation pattern. For example, the first insulation layer may be removed from the second area of the substrate by the following example processing steps: A photoresist pattern may be formed on the substrate such that the insulation pattern and the first active pattern on the first area of the substrate is covered with the photoresist pattern and the second insulation layer on the second area of the substrate is exposed through the photoresist pattern, and an etching process may be performed against the first insulation layer using the photoresist pattern as an etching mask.

In an example embodiment, the second single-crystalline semiconductor pattern may be formed on the substrate by the following example processing steps: The semiconductor layer may be formed on a whole surface of the second area of the substrate such that an upper surface of the semiconductor layer is coplanar with an upper surface of the first active pattern on the first area of the substrate. Then, a photoresist pattern may be formed on the substrate including the semiconductor layer on the second area and the first active pattern and the first device isolation pattern on the first area such that a portion of the semiconductor layer corresponding to the second field region is exposed through the photoresist pattern and the first active pattern and the first device isolation pattern on the first area are covered with the photoresist pattern. The recessed portion may be formed to a size greater than that of the opening by an anisotropic etching process using the photoresist pattern as an etching mask, and thus the residual semiconductor layer surrounding the recessed portion after the etching process may be formed into the second single-crystalline semiconductor pattern in the second area of the substrate.

In an example embodiment, the semiconductor layer may be formed on the substrate by the following example processing steps: A buffer layer may be formed on the first active pattern on the first area of the substrate and an epitaxial layer including the second single-crystalline semiconductor material may be formed on a surface of the second area of the substrate by a selective epitaxial growth (SEG) process. An upper portion of the epitaxial layer and the buffer layer may be removed from the first and second areas, respectively, by a planarization process, thereby forming the semiconductor layer on the second area of the substrate in such configuration that an upper surface of the semiconductor layer is coplanar with upper surfaces of the first active pattern and the first device isolation pattern. For example, the buffer layer may be formed on the first active pattern by a thermal oxidation process, and the SEG process includes deposition of single-crystalline semiconductor material by a chemical vapor deposition (CVD) process at a temperature of about 600° C. to about 1,200° C. The single-crystalline semiconductor material may include at least one material selected from the group consisting of silicon (Si), germanium (Ge), silicon germanium (SiGe), silicon carbide (SiC) and combinations thereof. The anisotropic etching process may include a plasma etching process.

In an example embodiment, the second device isolation pattern may be formed on the substrate by the following example processing steps: The second insulation layer may be formed on the substrate including the recessed portion on the second area and the first active pattern and the first device isolation pattern on the first area to a thickness so as to fill the recessed portion.

Then, the second insulation layer may be planarized until upper surfaces of the first active pattern and the first device isolation pattern are exposed such that the second insulation layer remains in the recessed portion to form a second insulation pattern on the second area of the substrate, so that the second insulation pattern is formed into the second device isolation pattern having a shape with a sidewall inclination angle that is opposite that of the first device isolation pattern. The second insulation layer may be formed on the substrate by a high-density plasma CVD (HDPCVD) process.

According to some example embodiments, a first active pattern and a first device isolation pattern may be formed on a cell area of a semiconductor substrate by an LEG process, and a second active pattern and a second device isolation pattern may be formed on a peripheral/core area of the semiconductor substrate by a partial CVD process after a SEG process on a whole surface of the peripheral/core area of the semiconductor substrate, to thereby minimize grain failures and lattice defects in the peripheral/core area of the semiconductor substrate.

BRIEF DESCRIPTION OF THE DRAWINGS

Example embodiments will be more clearly understood from the following detailed description taken in conjunction with the accompanying drawings. FIGS. 1 to 10 represent non-limiting, example embodiments as described herein.

FIG. 3 is a cross-sectional view illustrating a semiconductor device in accordance with an example embodiment of the present inventive concept;

FIG. 4 is a cross-sectional view illustrating a stacked semiconductor device in accordance with an example embodiment of the present inventive concept.

DETAILED DESCRIPTION OF EMBODIMENTS

Figure 1A:
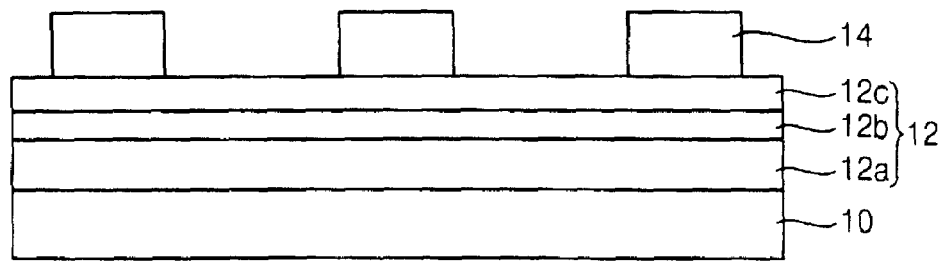
FIGS. 1A to 1F are cross-sectional views illustrating a method of manufacturing a conventional semiconductor device in which an active region is formed on a substrate by a laser-induced epitaxial growth (LEG) process.
Figure 1B:
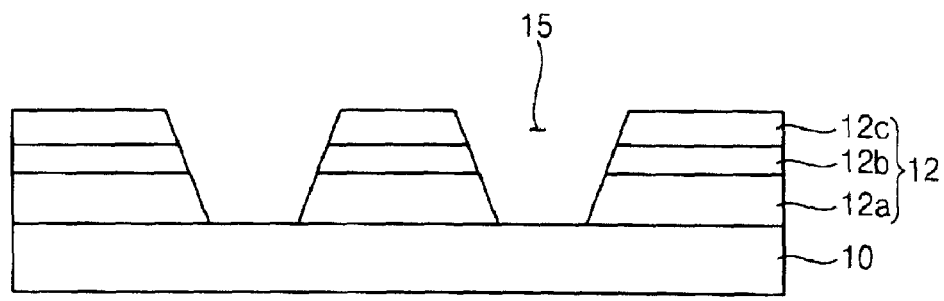
Figure 1C:
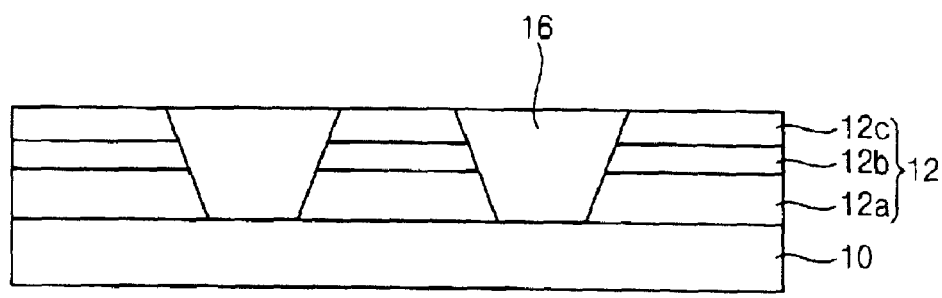
Figure 1D:
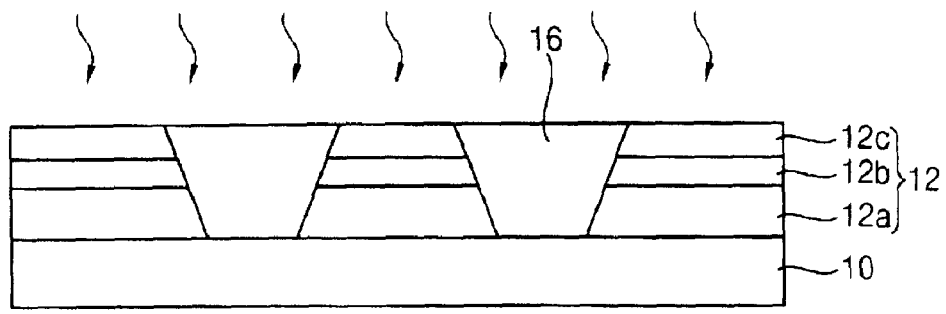
Figure 1E:
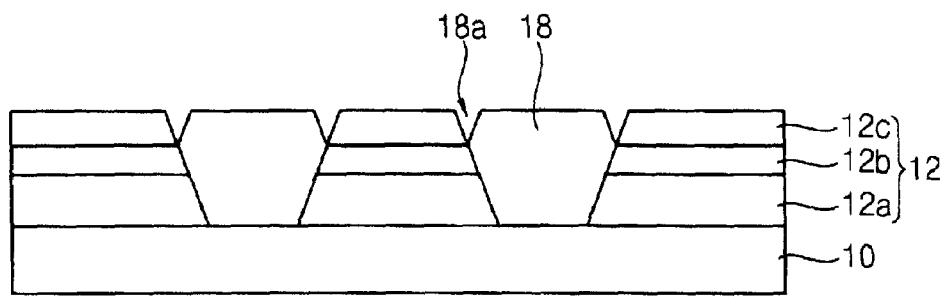
Figure 1F:
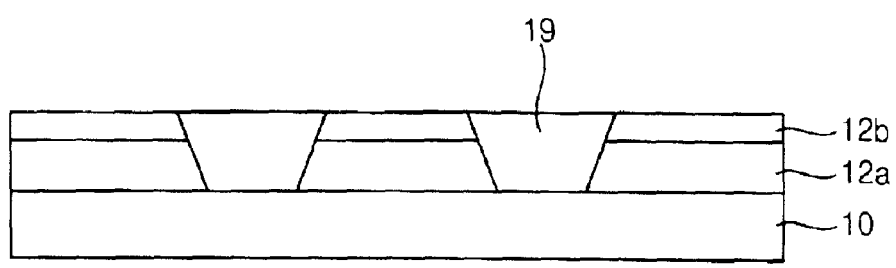
Figure 2A:
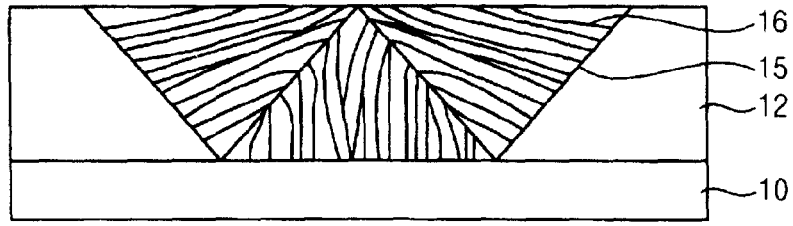
FIGS. 2A to 2D are views illustrating conventional processing steps for transforming a polysilicon layer into poly grains in the peripheral/core area of the substrate.
Figure 2B:
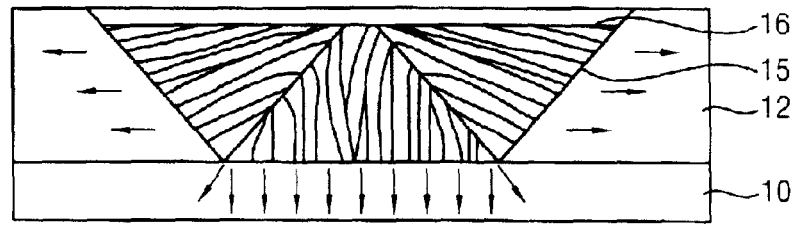
Figure 2C:
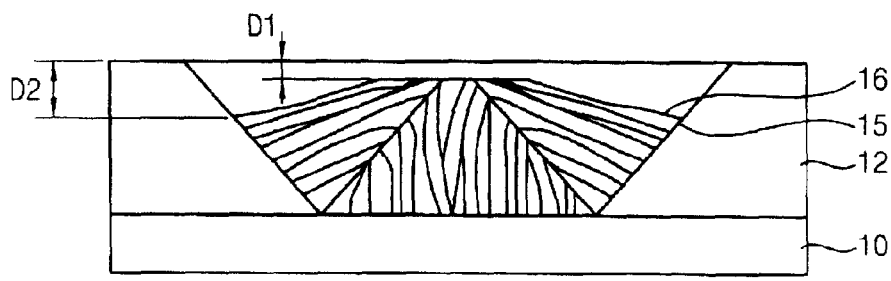
Figure 2D:
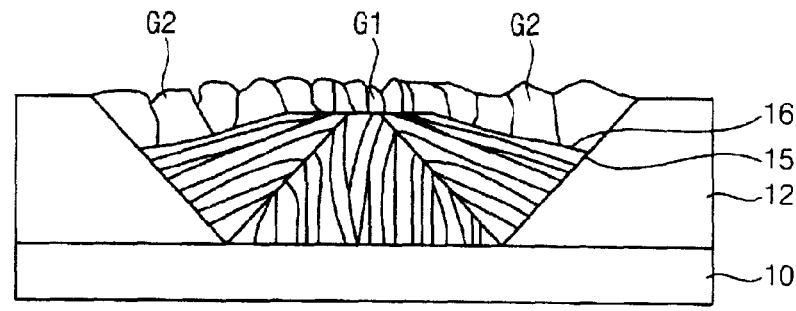

This application claims priority under 35 U.S.C. §119 to Korean Patent Application No. 10-2007-0132934, filed on Dec. 18, 2007 in the Korean Intellectual Property Office (KIPO), the content of which is herein incorporated by reference in its entirety.

Various example embodiments will be described more fully hereinafter with reference to the accompanying drawings, in which some example embodiments are shown. The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

Figure 3:
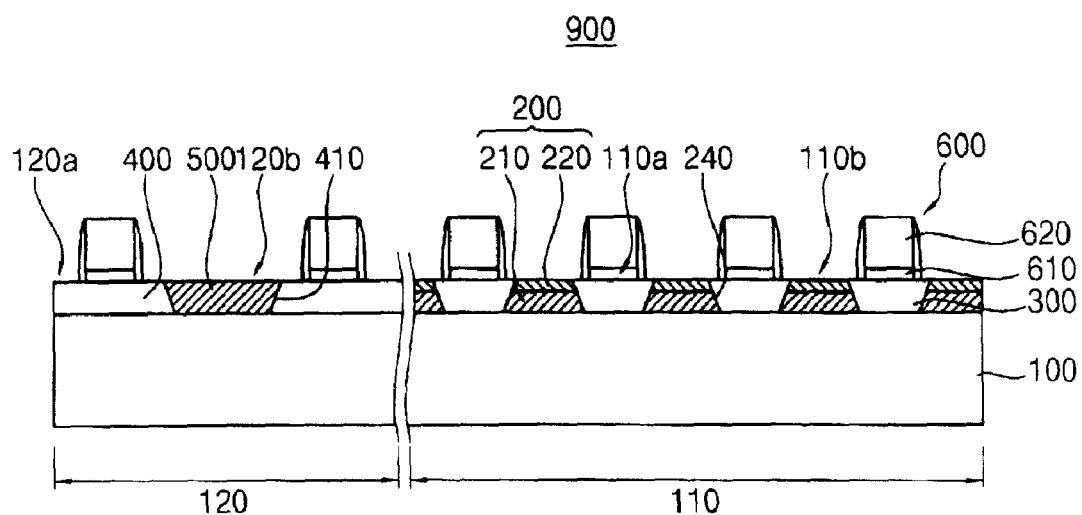

FIG. 3 is a cross-sectional view illustrating a semiconductor device in accordance with an example embodiment of the inventive concept.

Referring to FIG. 3, the semiconductor device 900 in accordance with an example embodiment of the inventive concept may include a semiconductor substrate 100 having a first area 110 and a second area 120 different from the first area 110, a first active pattern 300 including first single-crystalline semiconductor material on the first area 110 of the substrate 100, a first device isolation pattern 200 defining the first active pattern 300 and electrically insulating the adjacent first active patterns 300 from each other, a second active pattern 400 including second single-crystalline semiconductor material on the second area 120 of the substrate 100 and a second device isolation pattern 500 defining the second active pattern 400 and electrically insulating the adjacent second active patterns 400 from each other. The first device isolation pattern 200 may include first insulation material and the second device isolation pattern 500 may include second insulation material. A side profile of the first device insulation pattern 200 is opposite to that of the second device insulation pattern 500, meaning that the side profile of the first device isolation pattern is oriented in a downward diagonal direction, and a side profile of the second device isolation pattern is oriented in a downward diagonal direction.

In an example embodiment, the substrate 100 may include single-crystalline semiconductor material and include one or more of a single-crystalline silicon substrate, a single-crystalline germanium substrate and a single-crystalline silicon germanium substrate. Any other can also be used substrate materials would be also used as the substrate 100 under the condition that the substrate is capable of providing a single-crystalline seed in a subsequent SEG process that may be performed on the semiconductor substrate 100 to thereby form a single-crystalline semiconductor layer on the substrate 100. For example, the first area 110 of the substrate 100 may include a cell area of the semiconductor device in which first conductive structures are arranged on the first active pattern 300 at relatively small intervals and the second area 120 may include a peripheral/core area of the semiconductor device in which second conductive structures are arranged on the second active pattern 400 at relatively large intervals. The second conductive structures may transfer electrical signals to the first conductive structures in the semiconductor device.

In an example embodiment, the first device isolation pattern 200 and the first active pattern 300 may be positioned on the first area 110 of the substrate 100. The first area may include a first active region 110a on which the first conductive structures are arranged and a first field region 110b surrounding the first active region 110a, and the first device isolation pattern 200 may be positioned on the first field region 110b and the first active pattern 300 may be positioned on the first active region 110a in the first area 110 of the substrate 100. For example, the first device isolation pattern 200 may be formed on the first field region 110b of the first area 110 of the substrate 100 simultaneously with a partial removal of an insulation layer from the first area 110 of the substrate 100 for forming an opening 240 through which the first active region 110a is exposed. That is, a residual insulation layer remaining on the first field region 110b of the first area 110 of the substrate 100 after the removal process may be passively formed into the device isolation pattern 300.

In an example embodiment, the first device isolation pattern 200 may include an oxide pattern 210 on a surface of the first field region 110b of the substrate 100 and a nitride pattern 220 on the oxide pattern 210. An upper portion of the opening 240 is larger than a lower portion thereof, and thus a sidewall of the opening 240 is inclined in such a manner that the opening 24 is gradually widened upwards with respect to a surface of the substrate 10. Hereinafter, the same inclination of the sidewall as the opening 240 is referred to as upward-widened inclination.

In an example embodiment, the first active pattern 300 may include the first single-crystalline semiconductor material and may be formed in the opening 240 by a laser-induced epitaxial growth (LEG) process. For example, the first active pattern 300 may include a first epitaxial layer that is formed on the surface of the first active region 110a of the substrate 100 by the LEG process using the single-crystalline semiconductor material of the substrate 100 as a seed in the opening 240. Therefore, a sidewall of the first active pattern 300 also has the same upward-widened inclination as the opening 240.

The first device isolation pattern 200 can define and surround the first active pattern 300 in such a manner that the first conductive structures on the first active patterns 300 adjacent to each other are electrically insulated from each other. An upper surface of the first active pattern 300 may be coplanar with an upper surface of the nitride layer 220, and thus the first device isolation pattern 200 may function as a device isolation layer in the first area 110 of the substrate 100 and the first active pattern 300 including the first single-crystalline semiconductor material may function as an active region in the first area 110 of the substrate 100. For example, the first active pattern 300 may include single-crystalline silicon (Si), single-crystalline germanium (Ge), single-crystalline silicon germanium (SiGe), etc. These may be used alone or in combinations thereof.

In an example embodiment, a plurality of the second active patterns 400 on which the second conductive structures are positioned may be separated from each other by a recessed portion 410 in the second area 120 of the substrate 100. For example, an upper portion of the recessed portion 410 may be also larger than a lower portion thereof, and thus a sidewall of the recessed portion 410 may be inclined in such a manner that the recessed portion 410 gradually widens in an upward direction with respect to a surface of the substrate 100. Accordingly, the recessed portion 410 may have a sidewall of which the inclination is also upwardly widened in accordance with the shape of the opening 240 in which the recessed portion lies.

In an example embodiment, a thin layer may be removed from a surface of the substrate 100 in the second area 120 to thereby provide a bare substrate in the second area 120. A second epitaxial layer is formed on the bare substrate in the second area 120 by a selective epitaxial growth (SEG) process using single-crystalline silicon of the bare substrate as a seed and is partially removed from the bare substrate, to thereby form the recessed portion 410 through which a second field region 120b of the second area 120 is exposed. A residual second epitaxial layer remaining on a second active region of the second area 120 of the substrate 100 after the removal process for forming the recessed portion 410 may be passively formed into the second active pattern 400 on the second active region of the second area 120 of the substrate 100. That is, the second active pattern 400 including the second single-crystalline semiconductor may include the residual second epitaxial layer by the SEG process and can be formed on the second active region of the second area 120 simultaneously with a partial removal of the second epitaxial layer from the bare substrate for forming the recessed portion 410.

As described above, the insulation layer can be formed on an entire surface of the first area 110 of the substrate 100 and the opening 240 in which the first active pattern 300 is positioned may be formed by a partial removal of the insulation layer from the first area 110 of the substrate 100; thus, the residual insulation layer may be positioned at a lateral portion of the first area 110 of the substrate 100. In contrast, the second epitaxial layer is formed on an entire surface of the second area 120 of the substrate 100 and the recessed portion 410 in which the second device isolation pattern 500 is positioned can be formed by a partial removal of the second epitaxial layer from the second area 120 of the substrate 100; thus, the residual epitaxial layer can be positioned at a lateral portion of the second area 120 of the substrate 100. Therefore, when the SEG process for forming the second epitaxial layer is performed on an entire surface of the second area 120 of the substrate 100 after the formation of the first device isolation pattern 200 and the first active pattern 300, the second epitaxial layer may make contact with a sidewall of the residual insulation layer at the lateral portion of the first area 110 of the substrate 100, and thus, the second epitaxial layer may be prevented from growing by the residual insulation layer. That is, the sidewall of the residual insulation layer can function as a boundary surface of the second epitaxial layer at the lateral portion of the first area 110 of the substrate 100 and the SEG process is thus prevented from advancing by the boundary surface. Therefore, SEG process failures caused by lattice defects at the boundary surface between the second epitaxial layer and the residual insulation layer can be generated at the lateral portion of the first area 110 of the substrate 100.

However, the second active pattern 400 and the second device isolation pattern 500 in the second area 120 can be located spaced apart from the lateral portion of first area 110 of the substrate 100; thus, electrical operation of the second conductive structures on the second active pattern 400 would not be influenced by the SEG process failures on the boundary surface. That is, even though the second active pattern 400 is formed by the SEG process in the second area 120 of the substrate 100, operation failures caused by the lattice defects on the boundary surface can be minimized in the semiconductor device.

In addition, the opening 240 in the first area 110 can be formed by a partial removal of the insulation layer and the recessed portion 410 in the second area 120 can be formed by a partial removal of the second epitaxial layer including single-crystalline semiconductor material. The first active pattern 300 can be actively formed in the opening 240 by the LEG process in such a manner that the first epitaxial layer including the first single-crystalline semiconductor material is grown from a surface of the first area 110 to a sufficient thickness to fill the opening 240, and the residual insulation layer can be passively formed into the first device isolation pattern 200 after the partial removal process against the insulation layer for forming the opening 240. In contrast, the second device isolation pattern 500 may be actively formed into the recessed portions 410 by a CVD process in such a manner that second insulation material is deposited into the recessed portion 410 to a sufficient thickness to fill the recessed portion 410, and the residual second epitaxial layer can be passively formed into the second active pattern 400 including the second single-crystalline semiconductor material after the partial removal process of the second epitaxial layer for forming the recessed portion 410.

As described above, the upper portion of the recessed portion 410 can be also larger than the lower portion thereof, and thus the sidewall of the recessed portion 410 may be inclined in such a manner that the recessed portion 410 is gradually widened in an upward direction relative to the upper surface of the substrate 100. Accordingly, the recessed portion 410 can have a sidewall that is inclined in an upward direction so as to be widening in the same manner as the opening 240 in the first area 110 of the substrate 100.

Therefore, the sidewall of the first active pattern 300 in the first area 110 of the substrate 100 has an upward-widening inclination, while the sidewall of the second active pattern 400 in the second area 120 of the substrate 100 has an downward-widening inclination, opposite the first active pattern 300. Similarly, the first device isolation pattern 200 in the first area 110 has a downward-widening inclination and the second device isolation pattern 500 in the second area 120 has an upward-widening inclination opposite the first device isolation pattern 200.

In an example embodiment, the second active pattern 400 may include at least one of single-crystalline silicon (Si), single-crystalline germanium (Ge) and single-crystalline silicon germanium (SiGe), alone, or in combinations thereof. The second device isolation pattern 500 may include at least one of an oxide layer, a nitride layer and an oxynitride layer that are formed in the recessed portion 410 by a CVD process. In some embodiments, the second device isolation pattern 500 can include the same oxide layer 210 as that of the of the first device isolation layer 200. In addition, the upper surfaces of the first and second active patterns 300 and 400 can be coplanar with the upper surfaces of the device isolation patterns 200 and 500.

The first and second conductive structures on the first and second active patterns 300, 400 can include gate structures 600 of the semiconductor device. The gate structures 600 can include a gate insulation layer 610 on the surface of the first or second active pattern 300 or 400 and a gate conductive layer 620 on the gate insulation layer 610. Impurities can be implanted onto the surface portions of the first and second active patterns 300, 400 by an ion implantation process; thus, source/drain regions (not shown) may be formed on the first and second active patterns 300 and 400 adjacent the gate structure 600. Metal wirings (not shown) can be further electrically connected to the source/drain regions, and electrical signals may be applied to the gate structure through the metal wirings.

The gate structures and the metal wirings may be vertically stacked on the substrate in accordance with characteristics and uses of the semiconductor device. In particularly, in the case of static random access memory (SRAM) devices and flash memory devices, a stacked configuration of the gate structures can be employed to overcome space limitations. A plurality of the gate structures may be vertically stacked with insulation interlayers between them.

Figure 4:
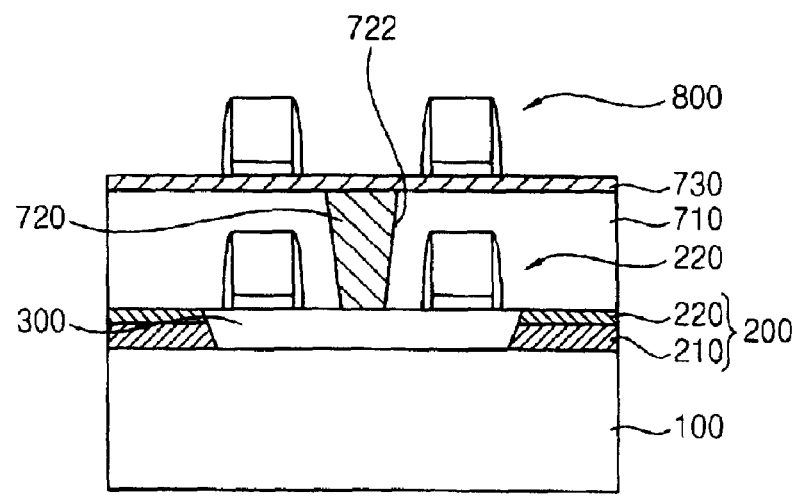

FIG. 4 is a cross-sectional view illustrating a stacked semiconductor device in accordance with an example embodiment of the present inventive concept. FIG. 4 exemplarily shows that the first conductive structures in the first area of the substrate shown in FIG. 3 are vertically stacked on the substrate, and thus the same reference numbers in FIG. 4 will be used to denote the same or like elements as those shown in FIG. 3. However, the gate structure 600 including the gate insulation layer 610 and the gate conductive layer 620 in FIG. 3 will be referred to as a lower gate structure including a lower gate insulation layer and a lower gate conductive layer for differentiating lower and upper conductive structures in the present example embodiment.

Referring to FIG. 4, the stacked semiconductor device in accordance with an example embodiment of the present inventive concept may include an insulation interlayer 710 that covers the lower gate structure 600 and has a planarized top surface. The insulation interlayer 710 may include a supplementary opening 722 through which the first active pattern 300 is partially exposed. A plug layer 720 including third single-crystalline semiconductor material is positioned in the supplementary opening 722 and an upper active layer 730 is positioned on the insulation interlayer 710 and on the plug layer 720. The upper active layer 730 may include fourth single-crystalline semiconductor material and can be electrically connected to the plug layer 720. An upper gate structure 800 can be located on the upper active layer 730 and include an upper gate insulation layer on the upper active layer 730 and an upper gate conductive layer on the upper gate insulation layer. Impurities can be implanted onto the surface portions of the upper active layer 730 by an implantation process using the upper gate structure 800 as an ion implantation mask, and thus upper source/drain regions may be located around the upper gate structure 800.

The lower and upper gate structures 600 and 800 may be electrically connected to each other by the plug layer 720 and may be physically separated from each other by the insulation interlayer 710, and thus each of the lower and upper gate structures 600 and 800 may function as an independent gate structure for the semiconductor device. The plug layer 720 and the upper active layer 730 may include an epitaxial layer including the third and fourth single-crystalline semiconductor material, respectively. Examples of the third and fourth single-crystalline semiconductor material may include at least one of silicon (Si), germanium (Ge) and silicon germanium (SiGe), etc. materials, alone or in combinations thereof. The vertically stacked structure improves space efficiency of the resulting semiconductor device.

Hereinafter, disclosed is a method of manufacturing the semiconductor device shown in FIG. 3.

FIGS. 5A to 5L are cross-sectional views illustrating processing steps for a method of manufacturing the semiconductor device shown in FIG. 3, according to the present inventive concept.

Figure 5A:
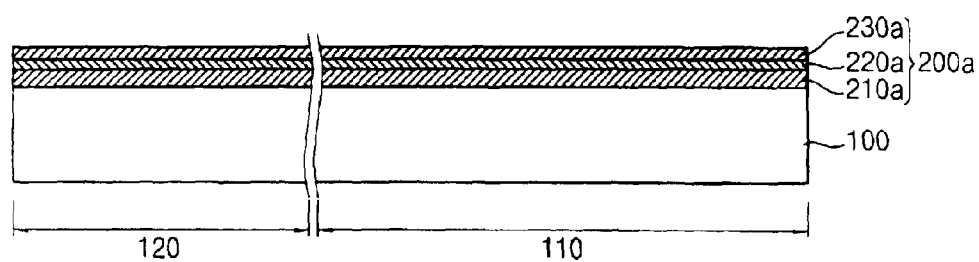
FIGS. 5A to 5L are cross-sectional views illustrating processing steps for a method of manufacturing the semiconductor device shown in FIG. 3 according to the present inventive concept.

Referring to FIGS. 3 and 5A, the semiconductor substrate 100 is prepared, and the first area 110 and the second area 120 are defined. A first insulation layer 200a is formed on the substrate 100.

In an example embodiment, the substrate 100 can comprise a semiconductor substrate including single-crystalline semiconductor material such as a silicon wafer including single-crystalline silicon (Si). However, any other material suitable for use as a semiconductor substrate can be employed, provided the substrate 100 includes single-crystalline semiconductor material and can operate as a seed material in a subsequent epitaxial process for forming a single-crystalline semiconductor layer. The first and second areas of the substrate 100 may comprise, in one embodiment, a cell area and a peripheral/core area of a semiconductor device, respectively. Therefore, the first conductive structures may be densely formed in the first area 110 and the second conductive structures may be sparsely formed in the second area 120 of the substrate 100. That is, the field regions for separating the active regions in which the conductive structures in the first area 110 are formed may be spaced apart from each other by a relatively small gap distance, while the field regions in the second area 120 may be spaced apart from each other by a relatively large gap distance.

In an example embodiment, the first insulation layer 200a may include a multilayer structure having a lower oxide layer 210a, a nitride layer 220a and an upper oxide layer 230a (ONO layer). For example, the lower oxide layer 210a may be formed on the substrate 100 to a thickness of about 3,000 Å by a thermal oxidation process, and the nitride layer 220a may be formed on the lower oxide layer 210a to a thickness of about 200 Å by a chemical vapor deposition (CVD) process. Then, the upper oxide layer 230a may be formed on the nitride layer 220a to a thickness of about 1,500 Å by a high-density plasma CVD (HDPCVD) process.

Figure 5B:
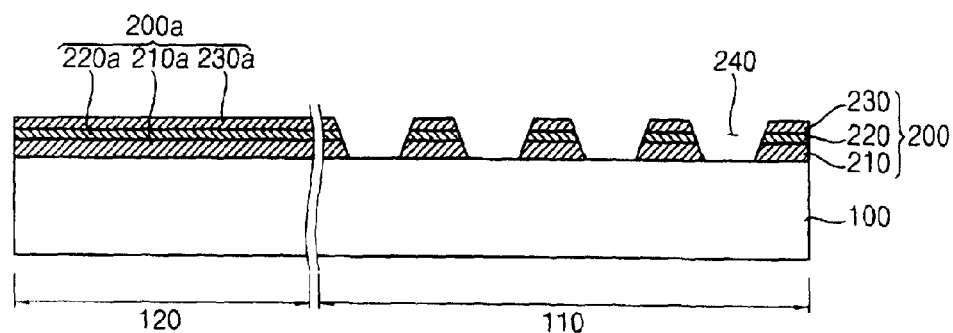

Referring to FIGS. 3 and 5B, the first insulation layer 200a in the first area 110 can be partially removed from the substrate 100 to thereby form an opening 240 through which the first active region 110a of the first area 110 is exposed in the first area 110 of the substrate 100. As a result, the first insulation layer 200a can be formed into a first insulation pattern 200 in the first area 110 of the substrate 100 after the partial removal of the first insulation layer 200a.

In an example embodiment, a photoresist pattern (not shown) may be formed on the first insulation layer 200a in such a manner that the first insulation layer 200a corresponding to the first active region 110a is exposed through the photoresist pattern. Then, the first insulation layer 200a may be partially removed from the first area 110a of the substrate 100 by an etching process using the photoresist pattern as an etching mask, and thus the first active region 110a may be exposed through the photoresist pattern. For example, the etching process may include an anisotropic process such as a dry etching process; thus, the opening 240 may be formed into such an inverted trapezoidal shape that an upper portion of the opening 240 adjacent to the upper oxide layer 230a is larger than a lower portion thereof adjacent to the substrate 100, and thus a sidewall of the opening 240 is inclined in such a manner that the opening 24 widens gradually in an upward direction with respect to a surface of the substrate 10. Accordingly, the first insulation layer 200a may be formed into the insulation pattern 200 in the first area 110 of the substrate 100 and the first insulation layer 200a in the second area 120 of the substrate 100 may remain on the substrate 100 as the first insulation layer 200a in the second area 120 can be covered with the photoresist pattern to prevent the etching process from being performed on the first insulation layer 200a in the second area 120 of the substrate 100.

Accordingly, the first insulation pattern 200 may include a lower oxide pattern 210, a nitride pattern 220 and an upper oxide pattern 230 and the first active region 110a of the substrate 100 may be exposed through the opening 240. For example, the opening 240 may be shaped to have an inverted trapezoid profile; thus, the upper portion of the opening 240 is made to be larger than the lower portion thereof and the sidewall of the opening 240 accordingly has an upward-widened inclination.

Then, the photoresist pattern may be removed from the first insulation pattern 200 and from the first insulation layer 200a on the second area 120 of the substrate 100 by a strip or an ashing process.

Figure 5C:
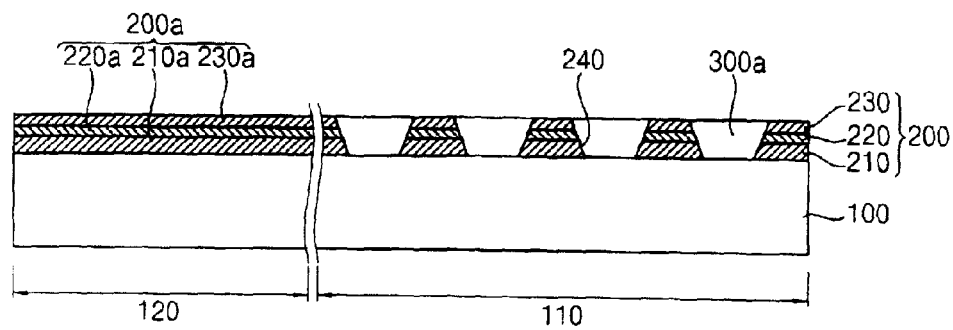

Referring to FIGS. 3 and 5C, a non-crystalline semiconductor pattern 300a is formed in the opening 240.

In an example embodiment, polycrystalline semiconductor material or amorphous semiconductor material is deposited onto the substrate 100, and thus a non-crystalline semiconductor layer (not shown) is formed on the substrate 100 to a sufficient thickness to fill up the opening 240. Then, an upper portion of the non-crystalline semiconductor layer can be removed from the substrate 100 by a planarization process such as an etch-back process and a CMP process, until an upper surface of the upper oxide pattern 230 is exposed. As a result, the non-crystalline semiconductor layer remains in the opening 240 and is locally separated by the insulation pattern

200 to thereby form the non-crystalline semiconductor pattern 300a on the first area 110 of the substrate 100.

For example, the polycrystalline semiconductor material or the amorphous semiconductor material can be deposited onto the substrate 100 including the first insulation pattern 200 by one of low-pressure CVD (LPCVD) process, a plasma-enhanced CVD (PECVD) process, an electron beam deposition process and an atomic layer deposition (ALD) process at a temperature of about 500° C. to about 1,000° C. As a modified example embodiment, impurities including elements in Group III or V in a periodic table may be implanted onto the substrate 100 simultaneously with the deposition process of the non-crystalline semiconductor material, to thereby improve electric properties of a single-crystalline semiconductor pattern that is to be formed in a subsequent process.

Figure 5D:
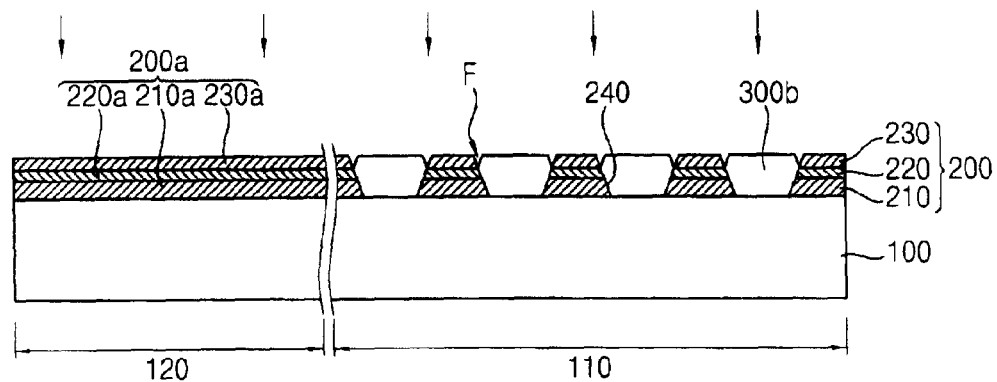

Referring to FIGS. 3 and 5D, a laser-induced epitaxial growth (LEG) process may be performed on the non-crystalline semiconductor pattern 300a, to thereby form a preliminary semiconductor pattern 300b in the opening 240.

In an example embodiment, a laser may be irradiated onto the non-crystalline semiconductor pattern 300a and the laser has a sufficient optical energy for momentarily melting the non-crystalline semiconductor pattern 300a. For example, an excimer laser having optical energy of about 1,000 mJ/cm$^2$ to about 2,500 mJ/cm$^2$ may be irradiated onto the non-crystalline semiconductor pattern 300a, and thus the non-crystalline semiconductor pattern 300a may be momentarily melted. Then, an epitaxial process may be performed in the opening 240 using single-crystalline semiconductor of an upper surface of the first active region 110a as a seed, and thus the non-crystalline semiconductor pattern 300a melted in the opening 240 may be recrystallized into the preliminary single-crystalline semiconductor pattern 300b. Particularly, the excimer laser may have sufficient optical energy for melting the entire non-crystalline semiconductor pattern 300a in the opening 240; thus, the preliminary single-crystalline semiconductor pattern 300b may be recrystallized from the non-crystalline semiconductor pattern 300a absent the presence of grains. An upper peripheral portion of the preliminary single-crystalline semiconductor pattern 300b may be spaced apart from an edge portion of the upper oxide pattern 230, to thereby form a facet defect F at an upper boundary surface between the preliminary single-crystalline semiconductor pattern 300b and the insulation pattern 200.

Figure 5E:
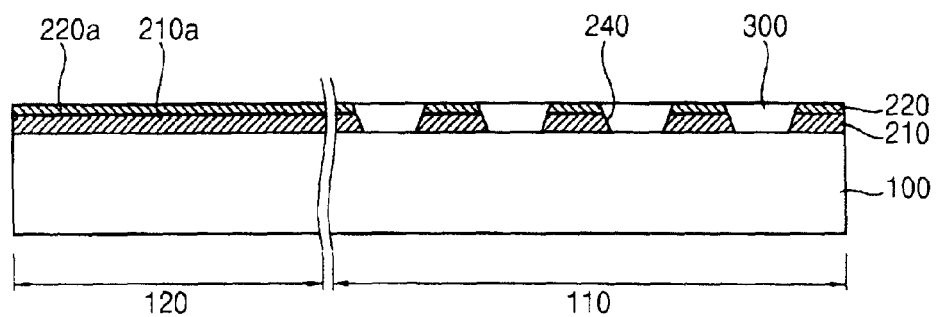

Referring to FIGS. 3 and 5E, a planarization process may be performed on the substrate 100 including the preliminary single-crystalline semiconductor pattern 300b, to thereby form a first single-crystalline semiconductor pattern 300 in the opening 240 and remove the facet defect F from the substrate 100.

In an example embodiment, the planarization process can be performed on the substrate 100 until the nitride pattern 220 in the first area 110 of the substrate 100 is exposed; thus, the upper portion of the preliminary single-crystalline semiconductor pattern 300b and the upper oxide pattern 230 in the first area 110 and the upper oxide layer 230a in the second area 120 can be removed from the substrate 100. Accordingly, an upper surface of the preliminary single-crystalline semiconductor pattern 300b is made to be coplanar with an upper surface of the nitride pattern 220 in the first area 110 and an upper surface of the nitride layer 220a in the second area 120 of the substrate 100, to thereby form a single-crystalline semiconductor pattern 300 in the opening 240 absent the presence of grains and absent the presence of facet defects. The single-crystalline semiconductor pattern 300 in the opening 240 can function as the first active pattern in FIG. 3, and thus the element designated by reference numeral 300 is referred to as a first single-crystalline semiconductor pattern 300 or the first active pattern 300.

Accordingly, the first single-crystalline semiconductor pattern 300 can be formed on the first active region 110a and can be surrounded by the insulation pattern 200 in the first area 110 of the substrate 100. Therefore, the first conductive structures on the adjacent single-crystalline semiconductor patterns 300 in the first area 110 of the substrate 100 are made to be electrically insulated from each other by the insulation pattern 200. That is, the single-crystalline semiconductor pattern 300 can function as the first active pattern and the insulation pattern 200 can function as the first device isolation pattern in the semiconductor device 900.

Figure 5F:
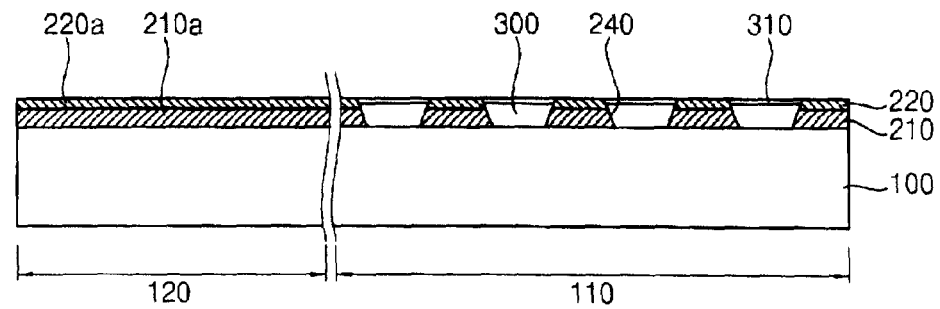

Referring to FIGS. 3 and 5F, a buffer layer 310 is formed on the first active pattern 300, and thus an upper surface of the active pattern 300 is prevented from being damaged in a subsequent process.

In an example embodiment, the buffer layer 310 can comprise a thermal oxide layer that is formed on the first active pattern 300 by a thermal oxidation process. The thermal oxide layer can be formed to penetrate into the first active pattern 300 rather than being grown from the surface of the first active pattern 300; thus, the thermal oxide layer may be formed on the active pattern 300 without increasing, or minimally increasing, the depth of the first active pattern 300. In the present example embodiment, the thermal oxide layer 310 can be formed on the first active pattern 300 to such a thickness so that a top surface of the thermal oxide layer is lower than a top surface of the nitride pattern 220. For example, the buffer layer 310 may be formed to a thickness of about 100 Å.

Figure 5G:
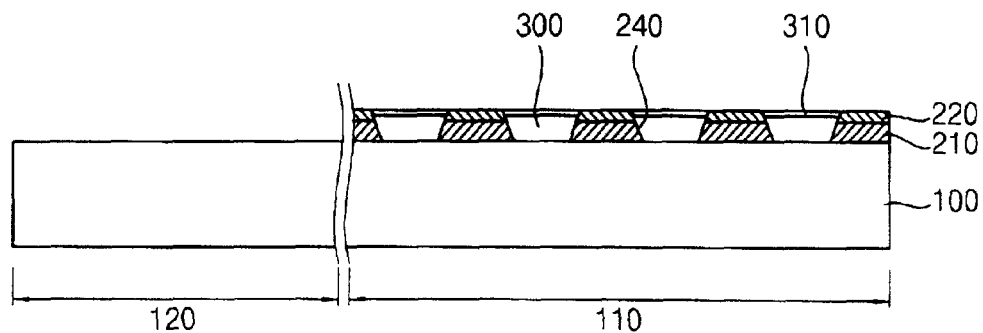

Referring to FIGS. 3 and 5G, the first insulation layer 200a may be removed from the second area 120 of the substrate 100, to thereby expose the surface of the second area 120 of the substrate 100.

In an example embodiment, a photoresist pattern (not shown) may be formed on the substrate 100 in such a manner that the second area 120 is exposed and the first area 110 is covered with the photoresist pattern. Then, the first insulation layer 200a may be removed from the second area 120 of the substrate 100 by an etching process using the photoresist pattern as an etching mask. In the present example embodiment, the first insulation layer 200a may include a multilayer structure having an ONO layer; thus, a dry etching process or a wet etching process may be used in accordance with layer characteristics of the first insulation layer 200a Thereafter, the photoresist pattern may be removed from the substrate 100 by a strip process or an ashing process.

Figure 5H:
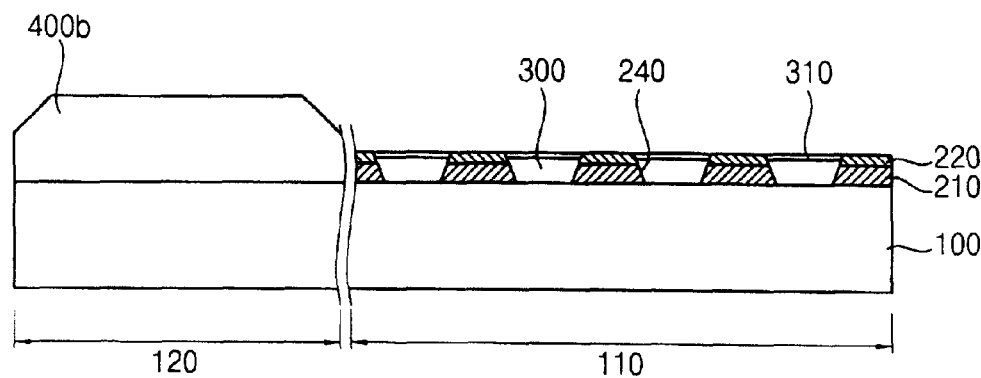

Referring to FIGS. 3 and 5H, a selective epitaxial growth (SEG) process may be performed on a surface of the second area 120 of the substrate 100, to thereby form an epitaxial layer 400b including single-crystalline semiconductor material on the second area 120 of the substrate 100.

In an example embodiment, the epitaxial layer 400b may be grown from the surface of the second area 120 of the substrate 100 by the SEG process using single-crystalline semiconductor material of the substrate 100 as a seed. Therefore, the epitaxial layer 400b may be formed into a single-crystalline semiconductor thin layer on the second area 120 of the substrate 100.

For example, the SEG process for forming the epitaxial layer 400b may include a CVD process in which layer material may be deposited onto the substrate at a temperature of about 700° C. to about 900° C. under a pressure of about 10 Torr to about 50 Torr.

The CVD process for the SEG process may include at least one of a reduced-pressure CVD (RPCVD) process, an LPCVD process, an ultra-high vacuum CVD (UHVCVD) process and a metal-organic CVD (MOCVD) process. Examples of materials that can be used for the layer include silicon (Si), germanium (Ge), silicon germanium (SiGe), silicon carbon (SiC), silicon germanium (SiGe) doped with carbon (C), silicon germanium (SiGe) doped with phosphorus (P), silicon germanium (SiGe) doped with boron (B), etc, alone or in combination thereof.

In an example embodiment, the SEG process may be performed for such a time that a entire surface of the second area 120 of the substrate 100 is covered with the epitaxial layer 400b. When the epitaxial layer 400b sufficiently covers the second area 120 of the substrate 100, the epitaxial layer 400b may have a thickness greater than that of the first active pattern 300 and the first device isolation pattern 200, as the SEG process is an isotropic process.

Figure 5I:
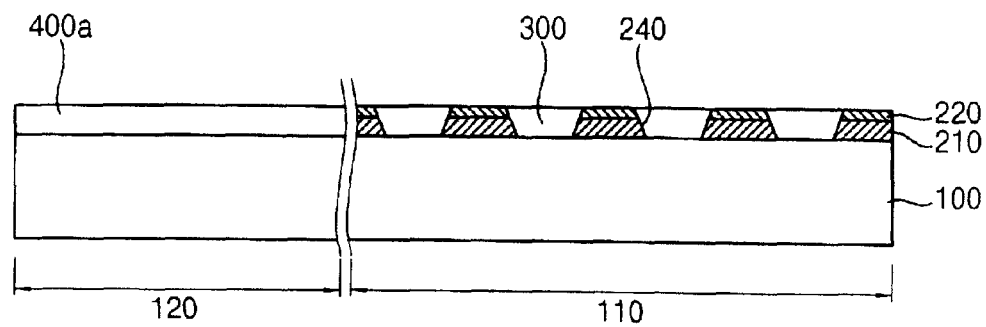

Referring to FIGS. 3 and 5I, an upper portion of the epitaxial layer 400b may be removed from the substrate 100 by a planarization process until the first active pattern 300 in the first area 110 is exposed, to thereby form a second single-crystalline semiconductor layer 400a on the second area 120 of the substrate 100. The planarization process may include a chemical mechanical polishing (CMP) process and an etch-back process. The buffer layer 310 and the nitride layer pattern 220 corresponding to a thickness of the buffer layer 310 may be removed from the first area 110 of the substrate 100 simultaneously with the epitaxial layer 400b in the planarization process. Accordingly, an upper surface of the second single-crystalline semiconductor layer 400a may be coplanar with the upper surfaces of the first active pattern 300 and the insulation pattern 200.

Figure 5J:
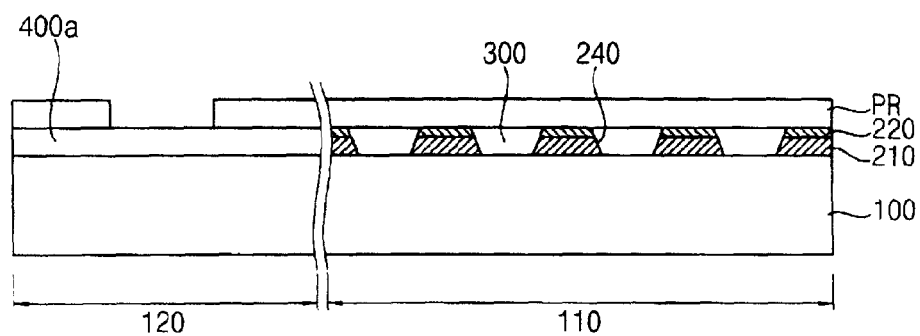
Figure 5K:
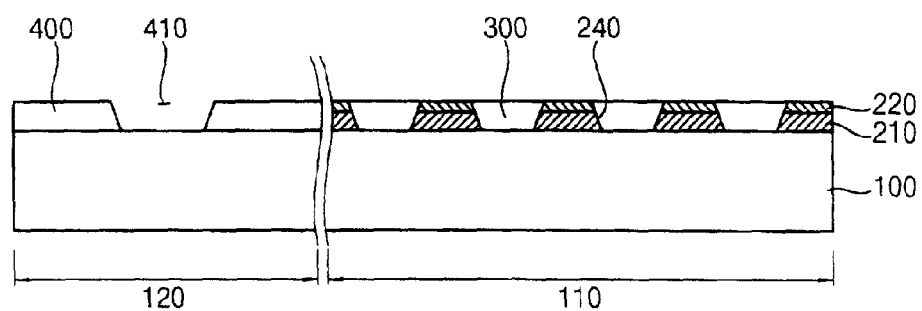

Referring to FIGS. 3, 5J and 5K, another photoresist pattern PR may be formed on the substrate in such a manner that the first area 110 of the substrate 100 is covered with the photoresist pattern PR and selected portions of the second single-crystalline semiconductor layer 400a corresponding to the second field region 120b in the second area 120 of the substrate 100 may be exposed through the photoresist pattern PR. Then, an anisotropic etching process may be performed on the second single-crystalline semiconductor layer 400a using the photoresist pattern PR as an etching mask; thus, the recessed portion 410 may be formed on the second area 120 of the substrate 100. The recessed portion 410 in the second area 120 may have a width that is greater than that of the opening 240 in the first area 110 and the shape of the second field region 120b of the second area 120 can be defined by the shape of the recessed portion 410. In the present example embodiment, the second single-crystalline semiconductor layer 400a may be partially removed from the second area 120 of the substrate 100 by a plasma etching process until a surface of the second field region 120a of the substrate 100 is exposed. While the present example embodiment discloses that a depth of the recessed portion 410 may be substantially identical to a thickness of the second single-crystalline semiconductor layer 400a, the depth of the recessed portion 410 may be varied in accordance with process conditions and specifications of the semiconductor device because both of the second single-crystalline semiconductor layer 400a and the substrate 100 may include single-crystalline semiconductor material, as would be known to one of ordinary skill in the art.

Accordingly, the second single-crystalline semiconductor layer 400a can be formed into the second single-crystalline semiconductor pattern 400 including the recessed portion 410.

Figure 5L:
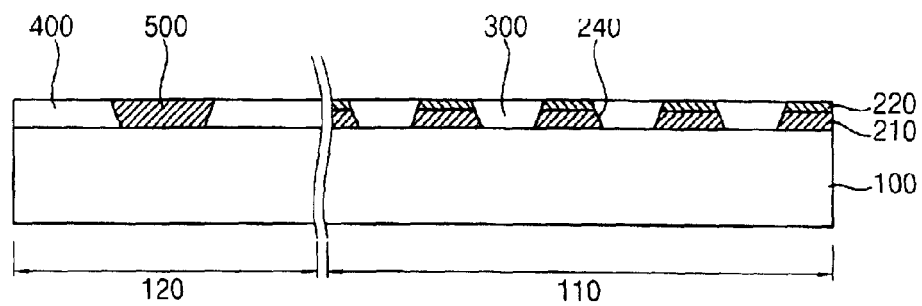

Referring to FIGS. 3 and 5L, the recessed portion 410 can be filled with a second insulation layer to thereby form the second device isolation pattern 500 on the second field region 120b of the second area 120. Therefore, elements of the second single-crystalline semiconductor pattern 400 can be electrically insulated from each other by the insulation layer in the recessed portion 410, and thus the second single-crystalline semiconductor pattern 400 is formed into the second active pattern on the second area 120 of the substrate 100.

In an example embodiment, insulation material may be deposited onto the substrate 100 including the first active pattern 300 and the recessed portion 410, to thereby form the second insulation layer (not shown) on the substrate 100 to a sufficient thickness to fill the recessed portion 410. Then, an upper portion of the second insulation layer can be removed from the substrate 100 by a planarization process until the upper surfaces of the first active pattern 300 and the insulation pattern 200 are exposed.

For example, the second insulation layer may include an HDP oxide layer that is formed by an HDPCVD process and the planarization process may include a CMP process and an etch-back process. Accordingly, the second insulation layer can remain in the recessed portion 410 to thereby form a second insulation pattern, and the second single-crystalline semiconductor pattern 400 can be defined by the second insulation pattern and be electrically insulated from surroundings. Upper surfaces of the second insulation pattern and the second single-crystalline semiconductor pattern 400 may be also coplanar with the upper surfaces of the first active pattern and the device isolation pattern. Therefore, the second insulation pattern can function as the second device isolation pattern and the second single-crystalline semiconductor pattern 400 can function as the second active pattern on the second area 120 of the substrate 100.

As described above, the SEG process for forming the single-crystalline semiconductor layer 400a can be performed on a whole surface of the second area 120 of the substrate 100, and thus the epitaxial layer 400b can be grown to a lateral portion of the first area 110 of the substrate 100 and the growth of the epitaxial layer 400b may be limited by the sidewall of the first insulation pattern 200 at the lateral portion of the first area 110. That is, the sidewall of the first insulation pattern 200 can function as a boundary surface of the epitaxial layer 400b at the lateral portion of the first area 110 of the substrate 100 and the SEG process can be prevented from advancing by the boundary surface. Therefore, the SEG process failures caused by the lattice defects on the boundary surface between the epitaxial layer 400b and the first insulation pattern may be generated at the lateral portion of the first area 110 of the substrate 100. However, the second active pattern 400 and the second device isolation pattern 500 in the second area 120 may be located separate from the lateral portion of first area 110 of the substrate 100; thus, electrical operation of the second conductive structures on the second active pattern 400 are not influenced by the SEG process failures on the boundary surface. That is, even though the second active pattern 400 may be formed by the SEG process in the second area 120 of the substrate 100, operation failures caused by the lattice defects on the boundary surface are minimized in the semiconductor device.

Accordingly, an active pattern may be formed on the first area of the substrate, which can comprise a cell area of a semiconductor device, by an LEG process, while a device isolation pattern may be formed on the second area of the substrate, which can comprise a peripheral/core area of the substrate, by a SEG process and a CVD process, to thereby minimize grain defects in the second area and lattice defects on the boundary surface between an epitaxial layer and an insulation layer.

The opening 240 in the first area 110 can be formed by a partial removal of the insulation layer and the recessed portion 410 in the second area 120 can be formed by a partial removal of the epitaxial layer including single-crystalline semiconductor material. The first active pattern 300 may be actively formed in the opening 240 by the LEG process in such a manner that the first epitaxial layer including the first single-crystalline semiconductor material is grown from a surface of the first area 110 to a sufficient thickness to fill up the opening 240, and the residual insulation layer in the first area 110 may be passively formed into the first device isolation pattern 200 after the partial removal process against the first insulation layer. In contrast, the second device isolation pattern 500 may be actively formed in the recessed portion 410 by a CVD process in such a manner that second insulation material is deposited into the recessed portion 410 to a sufficient thickness to fill up the recessed portion 410, and the residual second epitaxial layer in the second area 120 may be passively formed into the second active pattern 400 including the second single-crystalline semiconductor material after the partial removal process against the second epitaxial layer for forming the recessed portion 410.

As described above, the upper portion of the recessed portion 410 may be also larger than the lower portion thereof, and thus the sidewall of the recessed portion 410 may be inclined in such a manner that the recessed portion 410 is gradually widened in an upward direction with respect to an upper surface of the substrate 100. Accordingly, the recessed portion 410 can have sidewalls of which the inclination is also upwardly widened like the opening 240 in the first area 110 of the substrate 100.

Therefore, the first device isolation pattern 200 in the first area 110 has a downward-widened inclination and the second device isolation pattern 500 in the second area 120 has an upward-widened inclination opposite to the first device isolation pattern 200. Particularly, the first conductive structures may be positioned much more densely in the first area 110 than the second conductive structures in the second area 120 of the substrate 100, and thus a width of the second device isolation pattern 500 may be greater than that of the first device isolation pattern 200. Accordingly, an inclination angle of the sidewall of the recessed portion 410 may be greater than that of the sidewall of the opening 240, and thus the inclination angle of the second device isolation pattern 500 may be greater than that of the first device isolation pattern 200.

Thereafter, the first and second conductive structures may be formed on the first and second active patterns 300 and 400, respectively, and metal wirings for transferring electric signals to the first and second conductive structures may be formed on a resultant structure on the substrate 100, as shown in FIGS. 3 and 4 above. The first and second conductive structures may include a gate structure having a gate insulation layer on the respective active pattern and a gate conductive layer on the gate insulation layer.

According to some example embodiments, a first active pattern and a first device isolation pattern may be formed on a cell area of a semiconductor substrate by an LEG process, and a second active pattern and a second device isolation pattern may be formed on a peripheral/core area of the semiconductor substrate by a partial CVD process after a SEG process on an entire surface of the peripheral/core area of the semiconductor substrate, to thereby minimize grain failures and lattice defects in the peripheral/core area of the semiconductor substrate.

While embodiments of the invention have been particularly shown and described with references to preferred embodiments thereof, it will be understood by those skilled in the art that various changes in form and details may be made herein without departing from the spirit and scope of the invention as defined by the appended claims.

What is claimed is:
1. A semiconductor device comprising:
a semiconductor substrate having defined thereon a first area and a second area;
a first active pattern comprising first single-crystalline semiconductor material grown from a surface of the first area of the substrate;
a first device isolation pattern comprising first insulation material and defining the first active pattern, to thereby electrically insulate neighboring elements of the first active pattern from each other;
a second active pattern comprising second single-crystalline semiconductor material grown from a surface of the second area of the substrate;
a second device isolation pattern comprising second insulation material and defining the second active pattern, to thereby electrically insulate neighboring elements of the second active pattern from each other, a side profile of the second device isolation pattern having an inclination that is opposite that of a side profile of the first device isolation pattern;
first and second lower conductive structures on the first and second active patterns, respectively, the first lower conductive structure including a first lower gate insulation layer on a surface of the first active pattern and a first lower gate conductive layer on the first lower gate insulation layer, and the second lower conductive structure including a second lower gate insulation layer on a surface of the second active pattern and a second lower gate conductive layer on the second lower gate insulation layer;
an insulation interlayer covering the first lower conductive structure and having a supplementary opening through which the first active pattern is partially exposed, an upper surface of the insulation interlayer being planarized;
a plug layer comprising a third single-crystalline semiconductor material and filling the supplementary opening;
an upper active layer on the insulation interlayer, the upper active layer comprising a fourth single-crystalline semiconductor material and making contact with the plug layer; and
an upper conductive structure on the upper active layer, the upper conductive structure including an upper gate insulation layer on the upper active layer and an upper gate conductive layer on the upper gate insulation layer.
2. The semiconductor device of claim 1, wherein the first active pattern includes a first epitaxial pattern formed by a laser-induced epitaxial growth (LEG) process and the second active pattern includes a second epitaxial pattern formed by a selective epitaxial growth (SEG) process.
3. The semiconductor device of claim 1, wherein the first and second active patterns includes at least one material selected from the group consisting of silicon (Si), germanium (Ge), silicon germanium (SiGe), silicon carbide (SiC) and combinations thereof.

* * * * *